United States Patent
Kim et al.

(10) Patent No.: US 9,613,966 B2
(45) Date of Patent: Apr. 4, 2017

(54) SEMICONDUCTOR DEVICE

(71) Applicant: Samsung Electronics Co., Ltd., Suwon-si, Gyeonggi-do (KR)

(72) Inventors: Dae-ik Kim, Hwaseong-si (KR); Hyoung-sub Kim, Seongnam-si (KR); Sung-eui Kim, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 24 days.

(21) Appl. No.: 14/697,782

(22) Filed: Apr. 28, 2015

(65) Prior Publication Data

US 2015/0380508 A1    Dec. 31, 2015

(30) Foreign Application Priority Data

Jun. 27, 2014 (KR) .................. 10-2014-0079947

(51) Int. Cl.
*H01L 27/108* (2006.01)

(52) U.S. Cl.
CPC .. *H01L 27/10855* (2013.01); *H01L 27/10885* (2013.01); *H01L 27/10888* (2013.01); *H01L 27/10814* (2013.01); *H01L 27/10817* (2013.01); *H01L 27/10823* (2013.01)

(58) Field of Classification Search
CPC ........... H01L 27/10855; H01L 27/1088; H01L 27/10888; H01L 27/10814; H01L 27/10817; H01L 27/10823
See application file for complete search history.

(56) References Cited

U.S. PATENT DOCUMENTS

| | | | |
|---|---|---|---|
| 8,309,449 B2 | 11/2012 | Jeong et al. | |
| 9,269,720 B1* | 2/2016 | Bae | H01L 27/10814 |
| 9,490,256 B2* | 11/2016 | Kim | H01L 27/10814 |
| 2011/0024811 A1 | 2/2011 | Kim | |
| 2012/0012911 A1 | 1/2012 | Jeong | |
| 2012/0135579 A1 | 5/2012 | Park et al. | |
| 2012/0228702 A1 | 9/2012 | Wu | |
| 2014/0110851 A1* | 4/2014 | Kim | H01L 27/10885 257/773 |
| 2014/0210892 A1* | 7/2014 | Maruyama | B41J 2/21 347/14 |
| 2015/0056801 A1* | 2/2015 | Park | H01L 21/76814 438/655 |

(Continued)

FOREIGN PATENT DOCUMENTS

KR    10-1095063 B1    12/2011
KR    2012003742 A    1/2012

*Primary Examiner* — David Zarneke
(74) *Attorney, Agent, or Firm* — Harness, Dickey & Pierce, P.L.C.

(57) ABSTRACT

A semiconductor device includes a semiconductor substrate including a plurality of active areas, a bit line crossing the plurality of active areas, a direct contact connecting a first active area of the plurality of active areas with the bit line, an insulating spacer covering a side wall of the bit line and extending at a level lower than a level of an upper surface of the semiconductor substrate, a contact pad connected with a side wall of a second active area of the plurality of active areas, which neighbors the first active area, a first insulating pattern defining a contact hole exposing the insulating spacer and the contact pad, and a buried contact connected with the contact pad and filling the contact hole.

18 Claims, 27 Drawing Sheets

(56) References Cited

U.S. PATENT DOCUMENTS

2015/0364334 A1* 12/2015 Kang .................. H01L 21/3086
                                                        438/703
2016/0171187 A1*  6/2016 Durbha ................... G06F 21/10
                                                         726/29

* cited by examiner

SEMICONDUCTOR DEVICE

CROSS-REFERENCE TO RELATED APPLICATION

This application claims the benefit of priority from Korean Patent Application No. 10-2014-0079947, filed on Jun. 27, 2014, in the Korean Intellectual Property Office, the disclosure of which is incorporated herein in its entirety by reference.

BACKGROUND

The inventive concepts relate to a semiconductor device, and/or to a semiconductor device including a contact pad.

As semiconductor devices have become more highly integrated, a contact area of a buried contact and an active area has typically decreased. This causes an increase in wiring resistance and contact defects, thus leading to deterioration in electrical characteristics of the semiconductor devices, and also to difficulty in manufacturing the semiconductor devices.

SUMMARY

The inventive concepts relate to a semiconductor device including a contact pad to increase a contact area between a buried contact and an active area.

According to at least one example embodiment, a semiconductor device includes a semiconductor substrate including a plurality of active areas, a bit line crossing the plurality of active areas, a direct contact connecting a first active area of the plurality of active areas with the bit line, an insulating spacer covering a side wall of the bit line and extending at a level lower than a level of an upper surface of the semiconductor substrate, a contact pad connected with a side wall of a second active area of the plurality of active areas, which neighbors the first active area, a first insulating pattern defining a contact hole exposing the insulating spacer and the contact pad, and a buried contact connected with the contact pad and filling the contact hole.

A height of an upper surface of the contact pad may be lower than a level of an upper surface of the plurality of active areas.

The buried contact may extend to a level lower than the level of the upper surface of the semiconductor substrate, and may be connected to the contact pad at a level lower than the level of the upper surface of the semiconductor substrate.

The contact pad may contact the insulating spacer.

The semiconductor device may further include a second insulating pattern defining on the bit line a landing pad hole communicating with the contact hole, and a landing pad formed in the landing pad hole to be connected with the buried contact and to vertically overlap the bit line.

The landing pad may include the same material as the buried contact.

The semiconductor may further include a capacitor lower electrode connected with the buried contact.

The contact pad may include an epitaxial semiconductor layer.

The contact pad may include a polycrystalline semiconductor layer.

The contact pad may include a conductive material doped with carbon.

The contact pad may include a metal.

The semiconductor device may further include a recess communicating with the contact hole and exposing the contact pad, wherein the buried contact is connected with an inner wall of the recess.

The semiconductor device may further include a second contact pad contacting the inner wall of the recess, wherein the buried contact is connected with the second contact pad.

According to another example embodiment, a semiconductor device includes a semiconductor substrate including a plurality of active areas, a plurality of bit lines crossing a plurality of first active areas of the plurality of active areas and extending in a first direction, a plurality of word lines extending in a second direction that is different from the first direction, and a plurality of contact pads connected with side walls of a plurality of second active areas neighboring the plurality of first active areas in the second direction, and each of the contact pads is arranged between two adjacent pairs of the plurality of word lines.

The semiconductor device may further include a buried contact connected with the contact pad.

BRIEF DESCRIPTION OF THE DRAWINGS

Example embodiments will be more clearly understood from the following detailed description taken in conjunction with the accompanying drawings in which.

DETAILED DESCRIPTION

Figure 1:
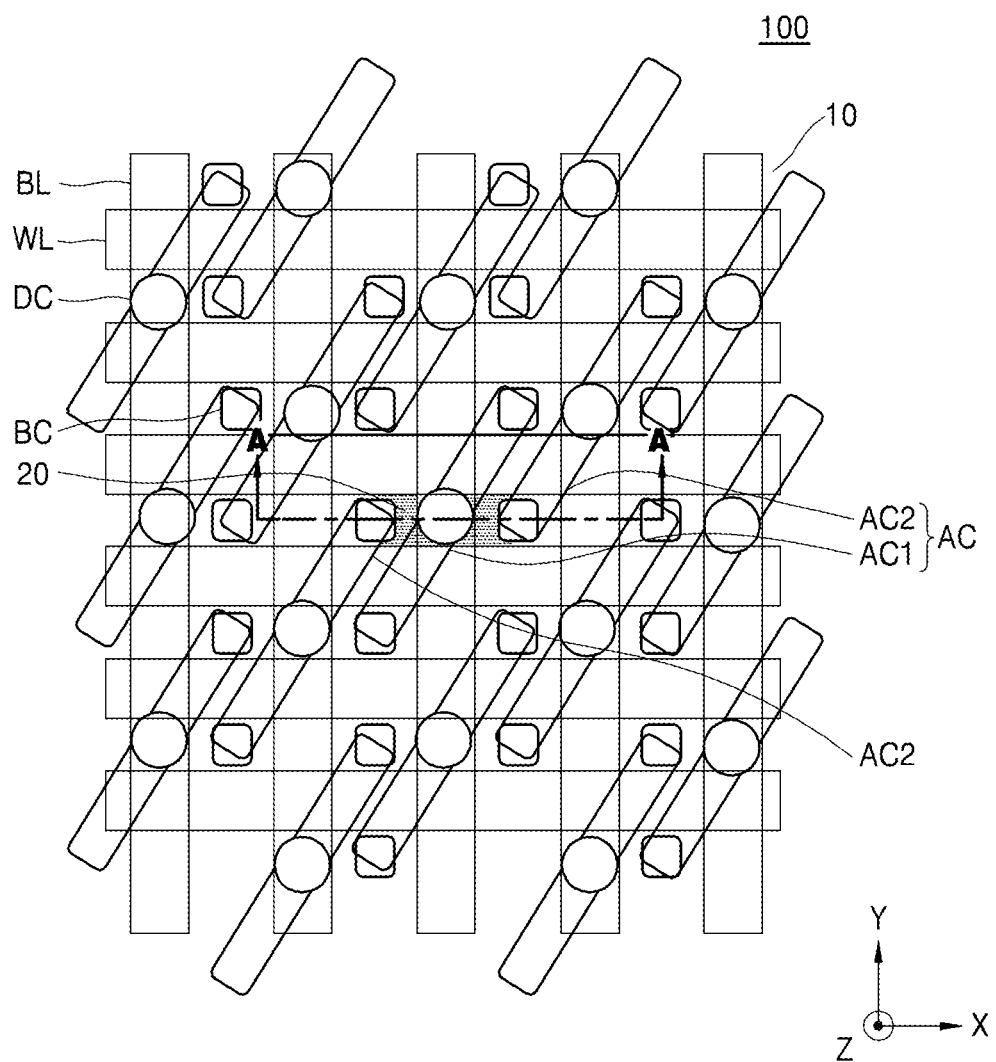
FIG. 1 is a plan view of a semiconductor device, according to various example embodiments.

The example embodiments will be described more fully hereinafter with reference to the accompanying drawings, in which elements of the invention are shown. The inventive concepts may, however, be embodied in many different forms and should not be construed as limited to the example embodiments set forth herein. Rather, these example embodiments are provided so that this disclosure will be thorough and complete, and will fully convey the scope of the inventive concepts to one of ordinary skill in the art. In the drawings, the same reference numerals denote the same elements and the thicknesses of layers and regions and the sizes of components may be exaggerated for clarity. As used herein, the term "and/or" includes any and all combinations of one or more of the associated listed items. Expressions such as "at least one of," when preceding a list of elements, modify the entire list of elements and do not modify the individual elements of the list.

It will be understood that when an element is referred to as being "on," "connected" or "coupled" to another element, it can be directly on, connected or coupled to the other element or intervening elements may be present. In contrast, when an element is referred to as being "directly on," "directly connected" or "directly coupled" to another element, there are no intervening elements present. As used herein the term "and/or" includes any and all combinations of one or more of the associated listed items. Further, it will be understood that when a layer is referred to as being "under" another layer, it can be directly under or one or more intervening layers may also be present. In addition, it will also be understood that when a layer is referred to as being "between" two layers, it can be the only layer between the two layers, or one or more intervening layers may also be present.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

Meanwhile, the terminology used herein is for the purpose of describing particular embodiments only and is not intended to be limiting of example embodiments. As used herein, the singular forms "a," "an," and "the" are intended to include the plural forms as well, unless the context clearly indicates otherwise. It will be further understood that the terms "comprises" and/or "comprising" used herein specify the presence of stated features, integers, steps, operations, members, components, and/or groups thereof, but do not preclude the presence or addition of one or more other features, integers, steps, operations, members, components, and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

In the drawing figures, the dimensions of layers and regions may be exaggerated for clarity of illustration. Like reference numerals refer to like elements throughout. The same reference numbers indicate the same components throughout the specification.

Although corresponding plan views and/or perspective views of some cross-sectional view(s) may not be shown, the cross-sectional view(s) of device structures illustrated herein provide support for a plurality of device structures that extend along two different directions as would be illustrated in a plan view, and/or in three different directions as would be illustrated in a perspective view. The two different directions may or may not be orthogonal to each other. The three different directions may include a third direction that may be orthogonal to the two different directions. The plurality of device structures may be integrated in a same electronic device. For example, when a device structure (e.g., a memory cell structure or a transistor structure) is illustrated in a cross-sectional view, an electronic device may include a plurality of the device structures (e.g., memory cell structures or transistor structures), as would be illustrated by a plan view of the electronic device. The plurality of device structures may be arranged in an array and/or in a two-dimensional pattern.

Hereinafter, example embodiments of the inventive concepts will be described in detail by referring to the drawings. The drawings illustrate essential parts of semiconductor devices according to examples embodiments.

FIG. 1 is a plan lay-out of a semiconductor device 100, according to various example embodiments.

Referring to FIG. 1, the semiconductor device 100 includes a plurality of active areas AC formed on a semiconductor substrate 10. The plurality of active areas AC may be formed by a device isolation layer, and may have, for example, an island shape in which the plurality of active areas AC are separate from one another. A plurality of bit lines BL cross a plurality of first active areas AC1 of the plurality of active areas AC and extend in a first direction (direction Y in FIG. 1). A plurality of word lines WL cross the plurality of active areas AC and extend along a second direction (direction X in FIG. 1) different from the first direction. Also, there are a plurality of second active areas AC2 which neighbor the plurality of first active areas AC1 in the second direction. A plurality of contact pads 20 are connected with side walls of the plurality of second active areas AC2 and arranged between two adjacent pairs of the plurality of word lines WL. In example embodiments, the plurality of bit lines BL may extend in parallel. Also, the plurality of word lines WL may extend in parallel.

In some example embodiments, the first direction is direction Y in FIG. 1 and the second direction is direction X in FIG. 1 so that the first and second directions may cross each other. However, example embodiments of the inventive concepts are not limited thereto. The second direction may be another direction that crosses the first direction.

A plurality of direct contacts DC may connect the plurality of bit lines BL to the plurality of first active areas AC1. A plurality of buried contacts BC are connected with the contact pad 20 connected with the plurality of second active areas AC2. Although it is not illustrated in FIG. 1, there is an insulating structure between the contact pad 20 and the first active area AC1 so that the contact pad 20 and the first active area AC1 are electrically insulated from each other.

In some example embodiments, the plurality of buried contacts BC may be serially arranged along the first direction or along the second direction. In some example embodiments, the buried contacts BC may be arranged along the second direction at equal intervals. In some example embodiments, the buried contact BC may electrically connect a lower electrode of a capacitor to the second active area AC2. Thus, the second active area AC2, the contact pad 20 connected with the second active area AC2, the buried contact connected with the contact pad 20, and the lower electrode of the capacitor connected with the buried contact BC may be electrically connected.

FIGS. 2 through 5 and FIGS. 6A through 9D are cross-sectional views of parts taken along a line A-A' of FIG. 1, according to at least one example embodiment. In FIGS. 2 through 5 and FIGS. 6A through 9D, like reference numerals denote like elements throughout.

Figure 2:
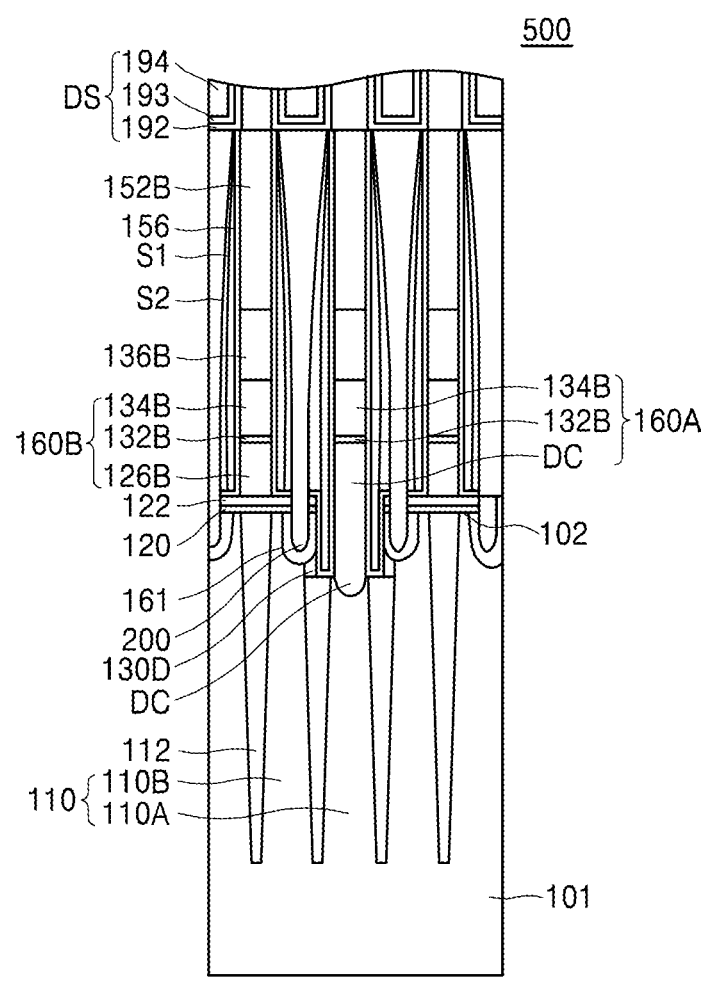
FIGS. 2 through 5 are cross-sectional views of essential parts of semiconductor devices, according to various example embodiments.

FIG. 2 is a cross-sectional view of a part of a semiconductor device 500 according to example embodiments.

Referring to FIG. 2, a semiconductor substrate 101 includes a plurality of active areas 110 defined by a device isolation layer 112. The plurality of active areas 110 may be arranged at equal intervals. A first insulating layer 120 and a second insulating layer 122 may be formed on the semiconductor substrate 101.

In some example embodiments, the semiconductor substrate 101 may include silicon (Si), for example, crystalline Si, polycrystalline Si, or amorphous Si. In some example embodiments, the semiconductor substrate 101 may include a semiconductor material, such as germanium (Ge), silicon germanium (SiGe), silicon carbide (SiC), gallium arsenide (GaAs), indium arsenide (InAs), or indium phosphide (InP).

In some example embodiments, the semiconductor substrate 101 may include a conductive area, for example, a well doped with impurities, or a structure doped with impurities.

In some example embodiments, the device isolation layer 112 may be formed of or include an oxide layer, a nitride layer, or a combination thereof, but it is not limited thereto. The device isolation layer 112 may be formed as a single layer formed of or including one type of insulating layer or as multiple layers formed of or including a combination of at least three types of insulating layers. In some example embodiments, the first insulating layer 120 may be formed of or include an oxide layer and the second insulating layer 122 may be formed of or include a nitride layer, but it is not limited thereto. In some example embodiments, just one insulating layer may be formed.

A first active area 110A of the plurality of active areas 110 is connected with a first bit line stack structure 160A, 136B, and 152B at a level lower than a level of the semiconductor substrate 101. In some example embodiments, the first bit line stack structure 160A, 136B, and 152B may be formed of or include a first bit line 160A, a capping layer 136B, and an insulating layer 152B. The first bit line 160A may be formed of or include a direct contact DC, a third conductive layer 132B, and a fourth conductive layer 134B.

Second bit line stack structures 160B, 136B, and 152B formed on the semiconductor substrate 101 are at both sides of the first bit line stack structure 160A, 136B, and 152B. The second bit line stack structure 160B, 136B, and 152B may be formed of or include a second bit line 160B, the capping layer 136B, and the insulating layer 152B. The second bit line 160B may be formed of or include a first conductive layer 126B, the third conductive layer 132B, and the fourth conductive layer 134B.

In some example embodiments, the first conductive layer 126B may be formed of or include doped polysilicon, but it is not limited thereto.

In some example embodiments, each of the third conductive layer 132B and the fourth conductive layer 134B may be formed of or include TiN, TiSiN, W, tungsten silicide, or a combination thereof. However, the third conductive layer 132B and the fourth conductive layer 134B are not limited thereto. In some example embodiments, the third conductive layer 132B may include TiSiN, and the fourth conductive layer 134B may include W. The capping layer 136B may be formed of or include a silicon nitride layer. In some example embodiments, the insulating layer 152B may be formed of or include a nitride layer, but is not limited thereto.

Side walls of the first and second bit line stack structures 160A, 136B, and 152B may be covered by an insulating liner 156 and insulating spacers S1 and S2. In some example embodiments, the insulating spacers S1 and S2 may be a single layer, double layers, or triple layers. According to example embodiments, the insulating spacers S1 and S2 are not limited to what is described above. The insulating spacers S1 and S2 may cover the insulating liner 156 formed at the side wall of the first bit line stack structure 160A, 136B, and 152B and extend at a level lower than a level of an upper surface 102 of the semiconductor substrate 101. In some example embodiments, the insulating liner 156 may be formed of or include a nitride layer, but it is not limited thereto. In some example embodiments, the insulating spacers S1 and S2 may be formed of or include a silicon oxide layer, a silicon nitride layer, air, or a combination thereof.

Second active areas 110B are located next to both sides of the first active area 110A. A buried contact 200 connected with a contact pad 130D may be formed at a side wall of the second active area 110B.

In some example embodiments, a level of an upper surface of the contact pad 130D may be lower than a level of the upper surface 102 of the semiconductor substrate 101. In some example embodiments, the buried contact 200 may extend to a level lower than the level of the upper surface 102 of the semiconductor substrate 101, and may be connected with the contact pad 130D at the level lower than the level of the upper surface 102 of the semiconductor substrate 101. In some example embodiments, the contact pad 130D may contact the insulating spacers S1 and S2.

In some example embodiments, the contact pad 130D may include a semiconductor layer epitaxially grown. For example, the contact pad 130D may be formed by using monocrystalline silicon, monocrystalline germanium, or monocrystalline silicon-germanium.

In some example embodiments, the contact pad 130D may include a conductive layer doped with carbon. For example, the contact pad 130D may include polysilicon doped with carbon. The conductive layer doped with carbon may serve to prevent the diffusion of a material forming the direct contact DC, for example, an n-type donor. In some example embodiments, the contact pad 130D may include a polycrystalline semiconductor layer doped with impurities. For example, the contact pad 130D may include a polysilicon layer doped with impurities. In some example embodiments, the contact pad 130D may include a metal. For example, the contact pad 130D may include Al, Cu, or W.

A metal silicide layer 161 may be formed between the buried contact 200 and the second active area 110B and between the buried contact 200 and the contact pad 130D. In some example embodiments, the metal silicide layer 161 may be formed of or include cobalt silicide. However, according to example embodiments, the metal silicide layer 161 is not limited to the material exemplified above and may be formed of or include one of various types of metal silicides. In some example embodiments, the metal silicide layer 161 may be omitted.

In some example embodiments, the buried contact 200 may be connected with a lower electrode 192 of a capacitor DS. The capacitor DS may include the lower electrode 192, a dielectric layer 193, and an upper electrode 194. Thus, the second active area 110B may be electrically connected with the lower electrode 192 of the capacitor DS through the contact pad 130D connected with the side wall of the second active area 110B, the metal silicide layer 161 on the contact pad 130D, and the buried contact 200 connected with the metal silicide layer 161.

Figure 3:
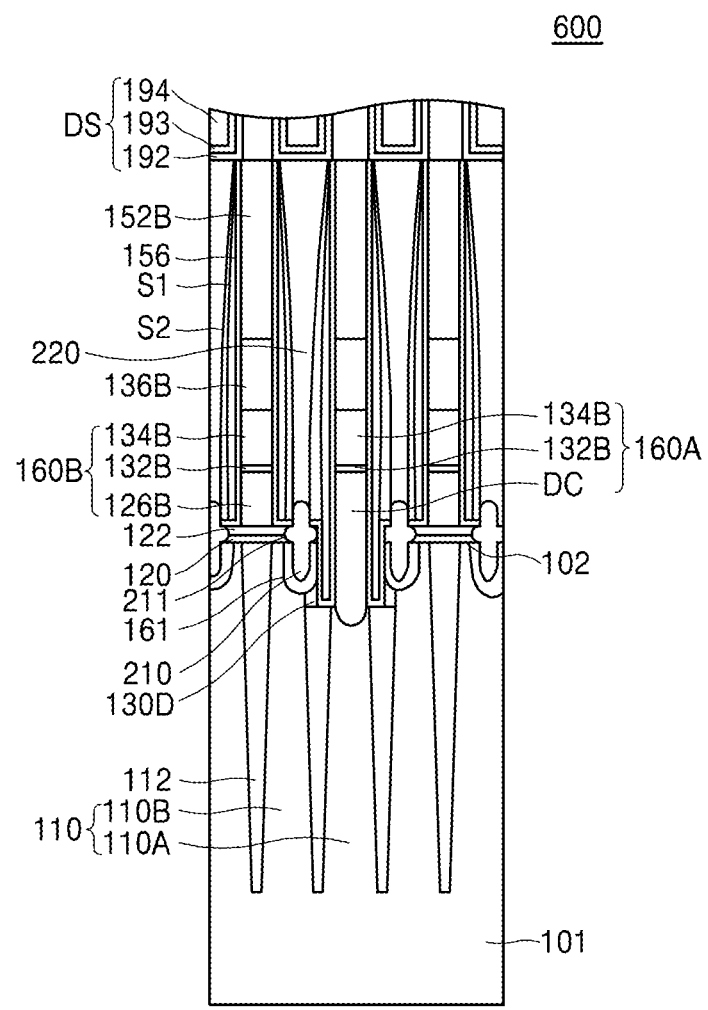

FIG. 3 is a cross-sectional view of a part of a semiconductor device 600 according to example embodiments. In FIGS. 3 through 9D, like reference numerals denote like elements in FIG. 2.

Referring to FIG. 3, the semiconductor device 600 may include a second contact pad 210 below a buried contact 220. A recess 211 to form the second contact pad 210 is provided below the buried contact 220. The insulating spacers S1 and S2 may include a material with an etching selectivity that is different from the etching selectivity of the insulating liner 156, the first insulating layer 120, and the second insulating layer 122. Thus, while the insulating liner 156, the first insulating layer 120, and the second insulating layer 122 are etched isotropically to form the recess 211, the insulating spacers S1 and S2 may not be etched. In the example semiconductor device 600, the second contact pad 210 contacts a side wall of the recess 211 and the buried contact 220 connected with the second contact pad 210 is further included. The second contact pad 210 may be formed as a conductive layer.

In some example embodiments, the second contact pad 210 may be connected with the first contact pad 130D formed at the side wall of the second active area 110B.

In some example embodiments, the second contact pad 210 and the buried contact 220 may include the same material. In some example embodiments, the buried contact 220 may be connected with an inner wall of the recess 211. In some example embodiments, the buried contact 220 may be connected with the lower electrode 192 of the capacitor DS.

Thus, the second active area 110B may be electrically connected with the lower electrode 192 of the capacitor DS via the first contact pad 130D connected with the side wall of the second active area 110B, the metal silicide layer 161 on the first contact pad 130D, the second contact pad 210 connected with the metal silicide layer 161, and the buried contact 220 connected with the second contact pad 210.

Figure 4:
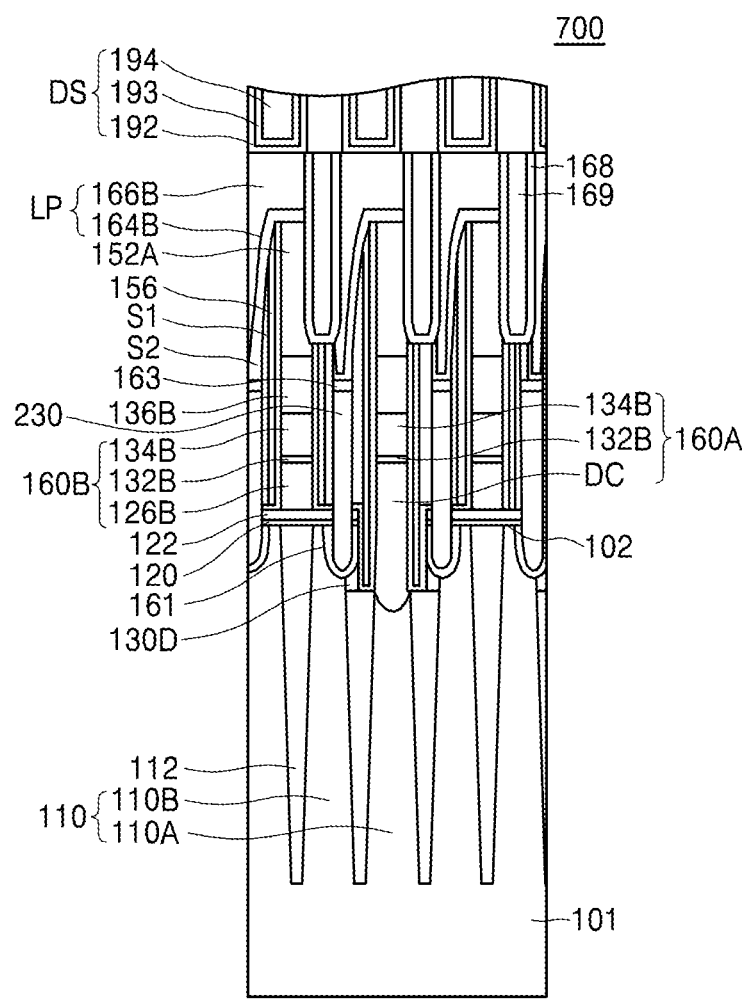

FIG. 4 is a cross-sectional view of a part of a semiconductor device 700 according to example embodiments.

Referring to FIG. 4, the semiconductor device 700 may further include a landing pad LP connected with a buried contact 230. The second active area 110B may be directly connected with the buried contact 230, or indirectly connected with the buried contact 230 via the contact pad 130D formed at the side wall of the second active area 110B. A metal silicide layer 163 may be formed on the buried contact 230. A barrier layer 164B may be formed on an upper surface of the buried contact 230, upper surfaces and side walls of the insulating liner 156 and the insulating spacers S1 and S2, and upper surfaces of the first and second bit line stack structures. An upper surface of the barrier layer 164B may be covered by a conductive layer 166B. The barrier layer 164B and the conductive layer 166B may be formed of or include a plurality of landing pads LP so that the buried contact 230 may be connected with the lower electrode 192 of the capacitor DS. A side wall of the landing pad LP may be covered by an insulating thin layer 168, and a space between a plurality of the landing pads LP may be filled by an insulating layer 169.

Thus, the second active area 110B may be electrically connected with the lower electrode 192 of the capacitor DS via the contact pad 130D connected with the side wall of the second active area 110B, the metal silicide layer 161 on the contact pad 130D, the buried contact 230 connected with the metal silicide layer 161, the metal silicide layer 163 connected with the buried contact 230, and the landing pad LP connected with the metal silicide layer 163.

In some example embodiments, the metal silicide layer 163 may be formed of or include cobalt silicide. In some example embodiments, the metal silicide layer 163 may be omitted. In some example embodiments, the barrier layer 164B may be formed as a stack of Ti/TiN. In some example embodiments, the conductive layer 166B may be formed of or include doped polysilicon, a metal, metal silicide, conductive metal nitride, or a combination thereof. In some example embodiments, the landing pads LP may have an island shape in which the landing pads are spaced apart from one another. The insulating thin layer 168B may be formed of or include a nitride layer, but it is not limited thereto.

Figure 5:
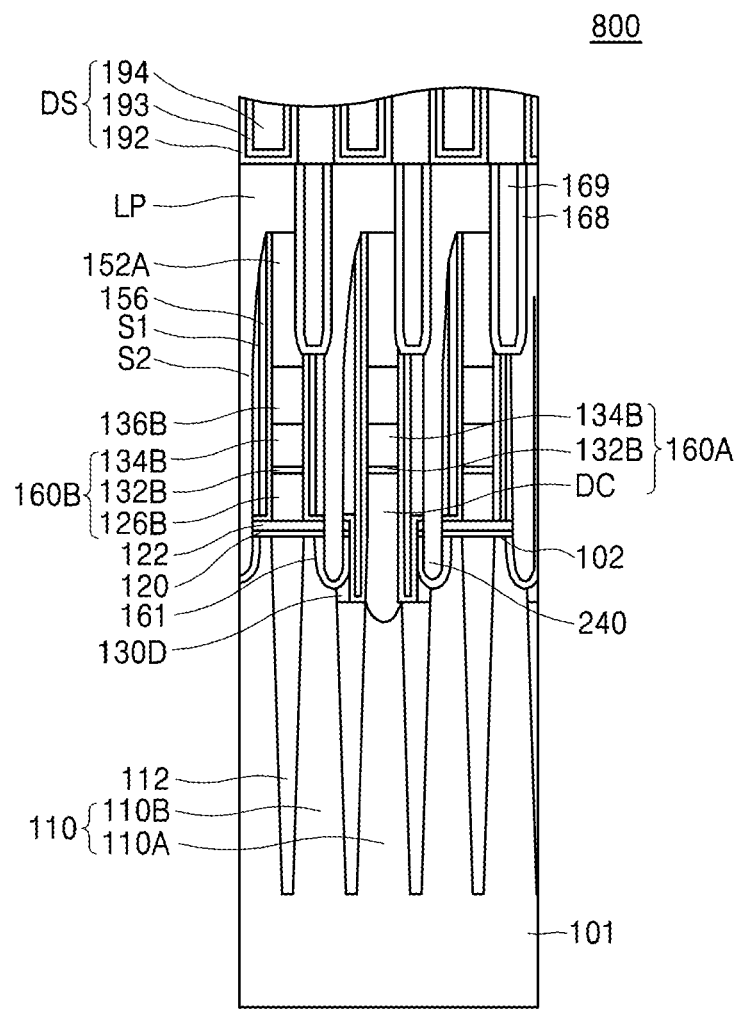

FIG. 5 is a cross-sectional view of a part of a semiconductor device 800 according to example embodiments.

Referring to FIG. 5, in the semiconductor device 800, the landing pad LP and a buried contact 240 are integrated, as the landing pad LP and the buried contact 230 of the semiconductor device 700 illustrated in FIG. 4.

Side walls of the buried contact 240 and the landing pad LP may be covered by the insulating thin layer 168 and the space between the landing pads LP may be filled with the insulating layer 169. The landing pad LP is connected with the buried contact 240 and the landing pad LP and the buried contact 240 include the same material. Thus, the second active area 110B of the semiconductor device 800 may be electrically connected with the lower electrode 192 of the capacitor DS via the contact pad 130D connected with the side wall of the second active area 110B, the metal silicide layer 161 on the contact pad 130D and the second active area 110B, the buried contact 240 connected with the metal silicide layer 161, and the landing pad LP integrally connected with the buried contact 240.

In some example embodiments, the buried contact 240 and the landing pad LP may be formed of or include doped polysilicon, a metal, metal silicide, conductive metal nitride, or a combination thereof.

FIGS. 6A through 6M are cross-sectional views describing a sequential process of manufacturing the semiconductor device 500, according to example embodiments.

Figure 6A:
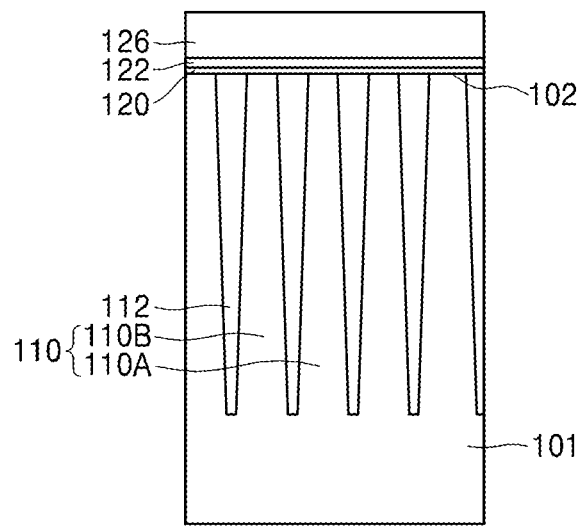
FIGS. 6A through 6M are cross-sectional views for describing a process of manufacturing a semiconductor device, according to various example embodiments.

Referring to FIG. 6A, the semiconductor substrate 101 includes the plurality of active areas 110 defined by the device isolation layer 112. The first insulating layer 120 and the second insulating layer 122 may be sequentially formed on the semiconductor substrate 101. A first conductive layer 126 is formed on the semiconductor substrate 101 on which the first insulating layer 120 and the second insulating layer 122 are formed. The upper surface 102 of the semiconductor substrate 101 contacts a bottom surface of the first insulating layer 120.

Figure 6B:
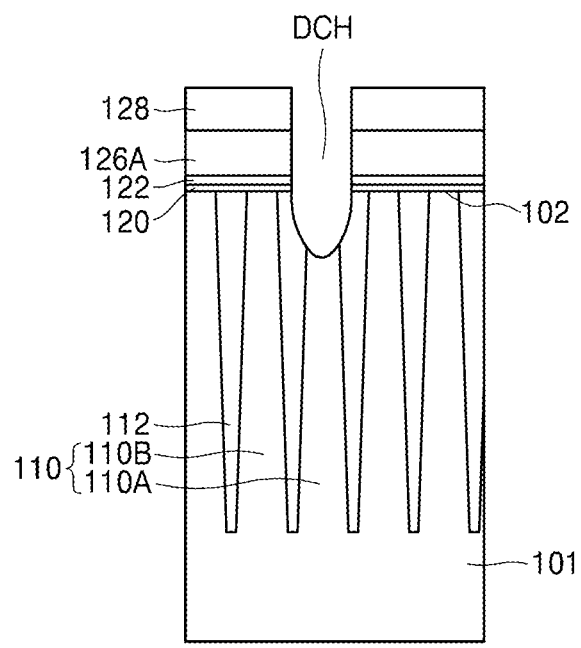

Referring to FIG. 6B, a mask pattern 128 is formed on the first conductive layer 126 of FIG. 6A. The mask pattern 128 includes an opening exposing a portion of the first conductive layer 126 of FIG. 6A. The first conductive layer 126 of FIG. 6A, the portion of which is exposed by the opening of the mask pattern 128, the first and second insulating layers 120 and 122, and the semiconductor substrate 101 are etched. As a result, a direct contact hole DCH exposing the first active area 110A of the semiconductor substrate 101 is formed. Also, a first conductive layer 126A including a pattern defining the direct contact hole DCH, and the first and second insulating layers 120 and 122 are formed.

In some example embodiments, the process of forming the mask pattern 128 may be performed by using a photolithography process.

Figure 6C:
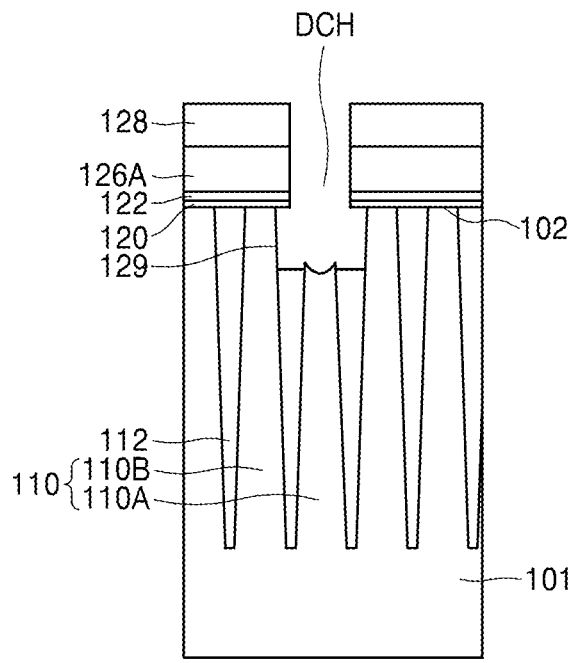

Referring to FIG. 6C, a recess 129 is formed by further etching the device isolation layer 112 contacting the direct contact hole DCH until the side walls of the second active areas 110B located next to both sides of the first active area 110A that includes the direct contact hole DCH are exposed.

Figure 6D:
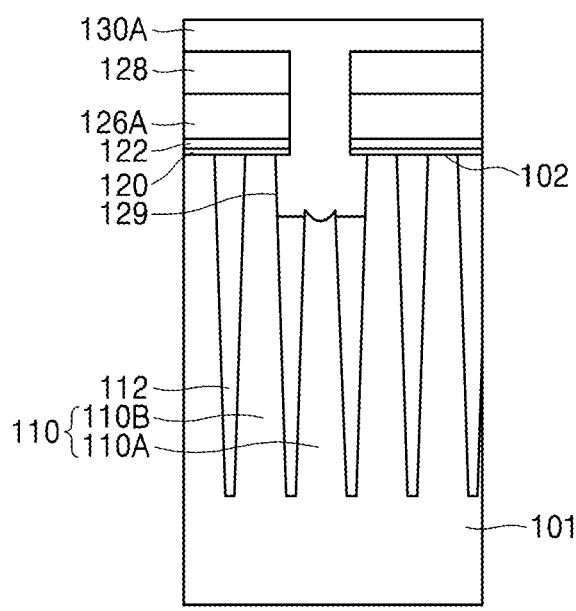

Referring to FIG. 6D, a conductive layer 130A is formed to fill the recess 129 and the direct contact hole DCH. In some example embodiments, the conductive layer 130A may be formed by performing a selective epitaxial growth (SEG) process with a conductive layer thinly deposited on the recess 129 and a lower surface of the direct contact hole DCH as a seed layer. Accordingly, the conductive layer 130A may include an epitaxial semiconductor layer having an identical crystal orientation with the semiconductor substrate 101. In some example embodiments, a chemical vapor deposition process, a low pressure chemical vapor deposition process, or an atomic layer deposition process may be performed to form the conductive layer 130A. Accordingly, a monocrystalline semiconductor layer, a polycrystalline semiconductor layer, a semiconductor layer doped with impurities, and a metal layer may be deposited.

Figure 6E:
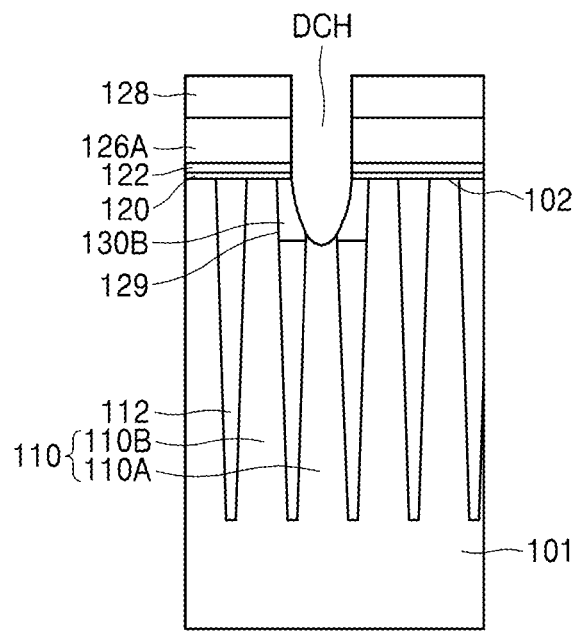

Referring to FIG. 6E, the conductive layer 130A of FIG. 6D is etched along the mask pattern 128 such that only a portion of the conductive layer 130A of FIG. 6D that fills the recess 129 remains. As a result, the conductive layer 130A of the FIG. 6D that fills the recess 129 forms the contact pad 130B. The side wall of the contact pad 130B contacts the second active area 110B. In the process of etching the conductive layer 130A of FIG. 6D to form the contact pad 130B, the lower surface of the direct contact hole DCH is further etched downwards so that the direct contact hole DCH may be formed at a level lower than a level of a lower surface of the recess 129.

Figure 6F:
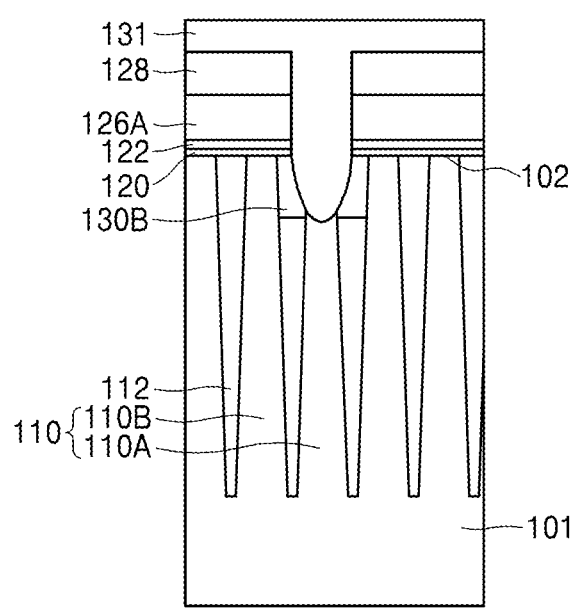

Referring to FIG. 6F, a second conductive layer 131 having a sufficient thickness to fill the direct contact hole DCH is formed in the direct contact hole DCH.

Figure 6G:
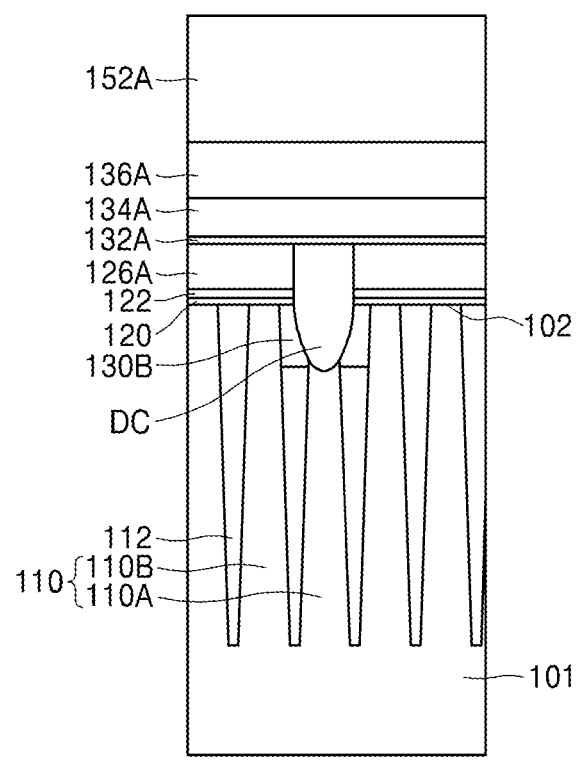

Referring to FIG. 6G, front surfaces of the mask pattern 128 and the second conductive layer 131 are removed so that the second conductive layer 131 of FIG. 6F remains only in the direct contact hole DCH, thereby forming the direct contact DC formed of or including the second conductive layer 131 of FIG. 6F that remains in the direct contact hole DCH. A third conductive layer 132A, a fourth conductive layer 134A, a capping layer 136A, and an insulating layer 152A may be formed, for example, sequentially formed, on the first conductive layer 126A and the direct contact DC.

Figure 6H:
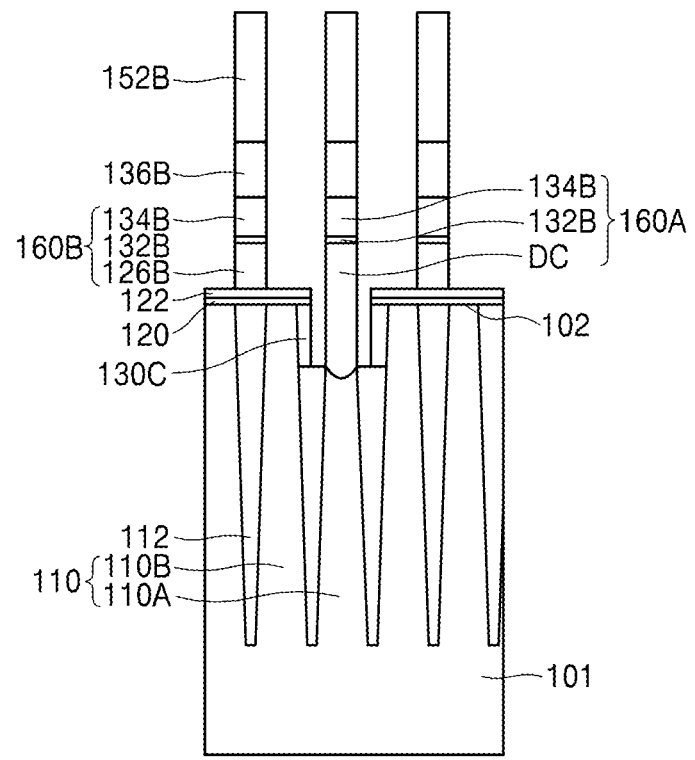

Referring to FIG. 6H, the insulating layer 152A and the capping layer 136A of FIG. 6G are patterned by using a photolithography process. As a result, the insulating layer 152B and the capping pattern 136B, which are to be used as an etch mask to form the plurality of bit lines, are formed. In some example embodiments, an opened portion of the insulating layer 152B may include the direct contact DC area of FIG. 6G. A portion of a bottom structure is etched by using the insulating layer 152B and the capping pattern 136B as the etch mask in order to form the plurality of bit lines 160.

In more detail, exposed portions of the first conductive layer 126A, the third conductive layer 132A, and the fourth conductive layer 134A of FIG. 6G are etched by using the insulating layer 152B and the capping pattern 136B as the etch mask, in order to form the first and second bit lines 160A and 160B. Thus, the first bit line 160A is formed of or include the direct contact DC, the third conductive pattern 132B, and the fourth conductive pattern 134B and the second bit line 160B is formed of or include the first conductive pattern 126B, the third conductive pattern 132B, and the fourth conductive pattern 134B. The first and second bit lines 160A and 160B may be connected with the first active area 110A of the semiconductor substrate 101 via the direct contact DC.

According to at least one example embodiment, when the opened portion of the mask pattern 152B includes a portion of the area in which the direct contact DC of FIG. 6G is formed, the area in which the direction contact DC is formed may be etched to a level lower than a level of the upper surface 102 of the semiconductor substrate 101 by the above-described etching process to form the first and second bit lines 160A and 160B. Accordingly, portions of both side walls of the direct contact DC of FIG. 6G, a portion of the first active area 110A, a portion of the device isolation layer 112, and a portion of the contact pad 130B of FIG. 6G are etched. As a result, a contact pad 130C is separated from the first active area 110A and is connected only with the second active area 110B and the device isolation layer 112.

Figure 6I:
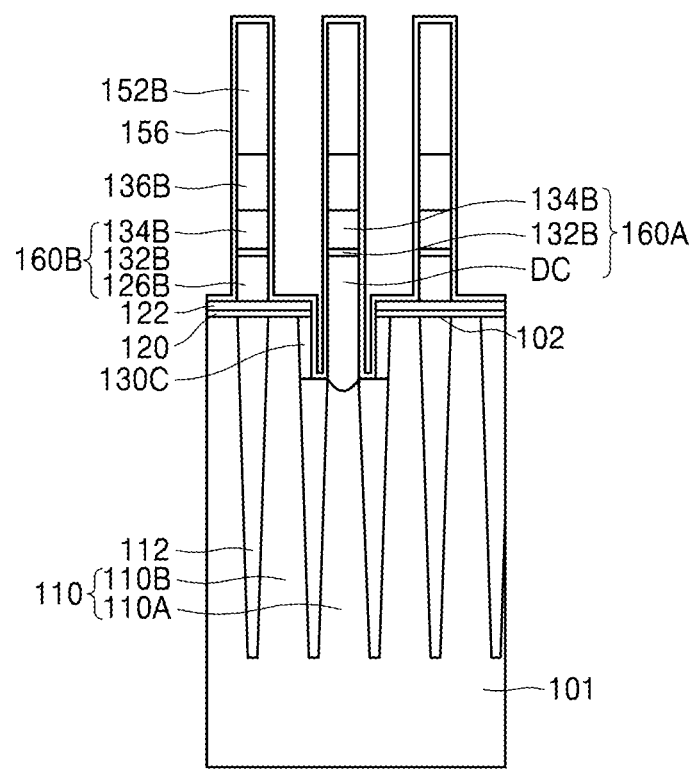

Referring to FIG. 6I, the insulating liner 156 is formed on an upper surface of the resulting structure of the first and second bit lines 160A and 160B, the capping layer 136B, and the mask pattern 152B. In some example embodiments, when the opened portion of the mask pattern 152B includes a portion of the area in which the direct contact DC of FIG. 6G is formed, the area in which the direct contact DC is formed may be etched to a level that is lower than the level of the upper surface 102 of the semiconductor substrate 101. As a result, the insulating liner 156 may be formed in inner walls of the direct contact DC, the first active area 110A, the device isolation layer 112, and the contact pad 130C, which are lower than the upper surface 102 of the semiconductor substrate 101.

Figure 6J:
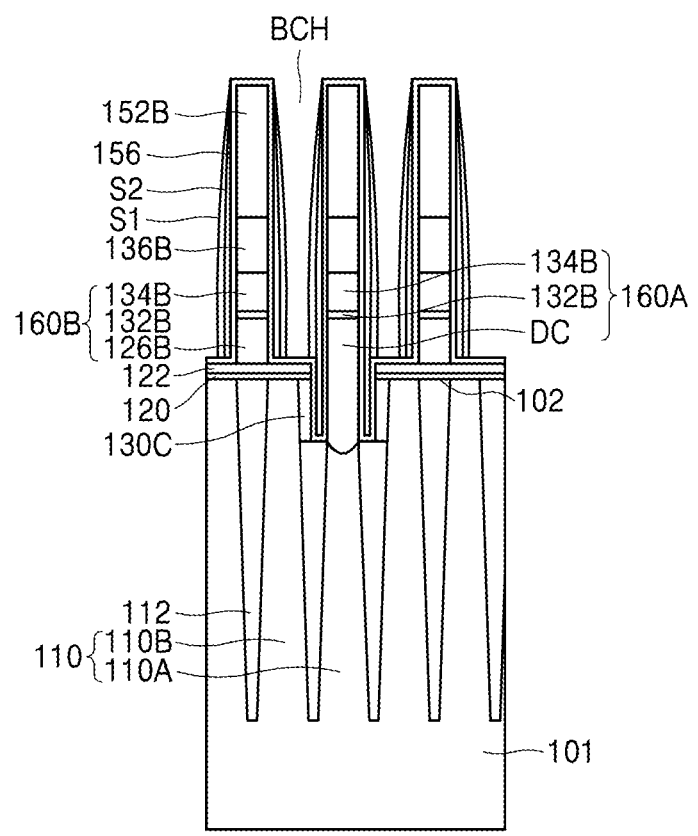

Referring to FIG. 6J, the plurality of insulating spacers S1 and S2 covering the insulating liner 156, and the first and second bit line stack structures including the first and second bit lines 160A and 160B, the capping layer 136B, and the mask pattern 152B, are formed. In some example embodiments, the insulating spacers S1 and S2 may be formed as a single layer, double layers, or triple layers. However, example embodiments are not limited thereto.

Figure 6K:
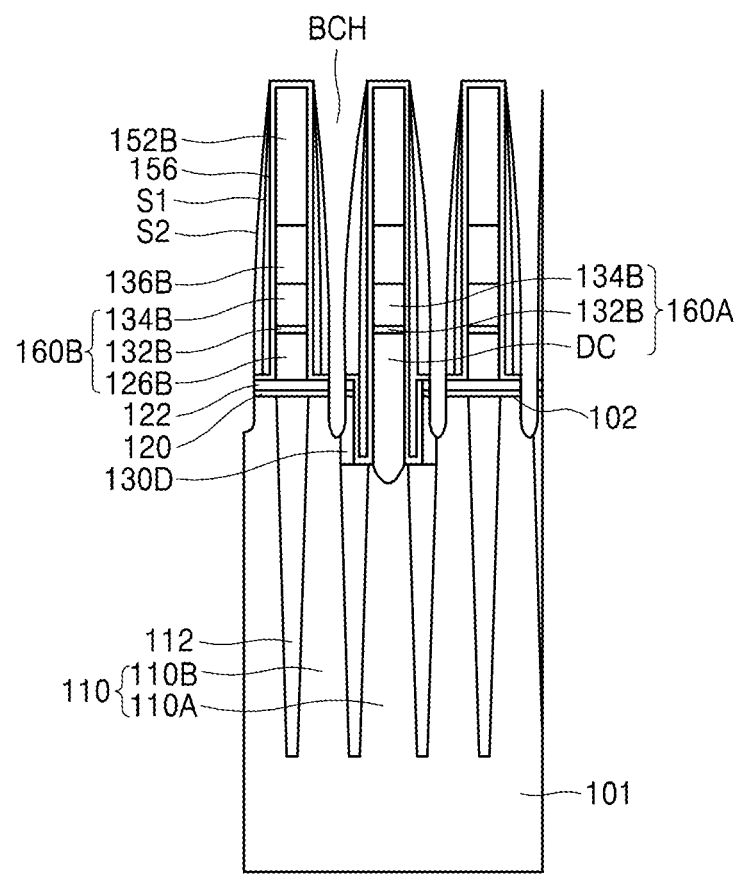

Referring to FIG. 6K, a plurality of buried contact holes BCH to form the buried contact may be formed in spaces between the first and second bit line stack structures including the first and second bit lines 160A and 160B, the capping layer 136B, and the mask pattern 152B. In detail, a plurality of insulating patterns defining the buried contact in the spaces between the first and second bit line stack structures may be formed, and the resulting structure of FIG. 6J is etched. As a result, the active area 110 of the semiconductor substrate 101 is exposed via the buried contact hole BCH. A contact pad 130D, which is the contact pad 130C of FIG. 6J whose upper surface or side surface is partially etched, may be formed by the above-described etching. Accordingly, the contact pad 130D may have an upper surface which is lower than the upper surface 102 of the semiconductor substrate 101.

Figure 6L:
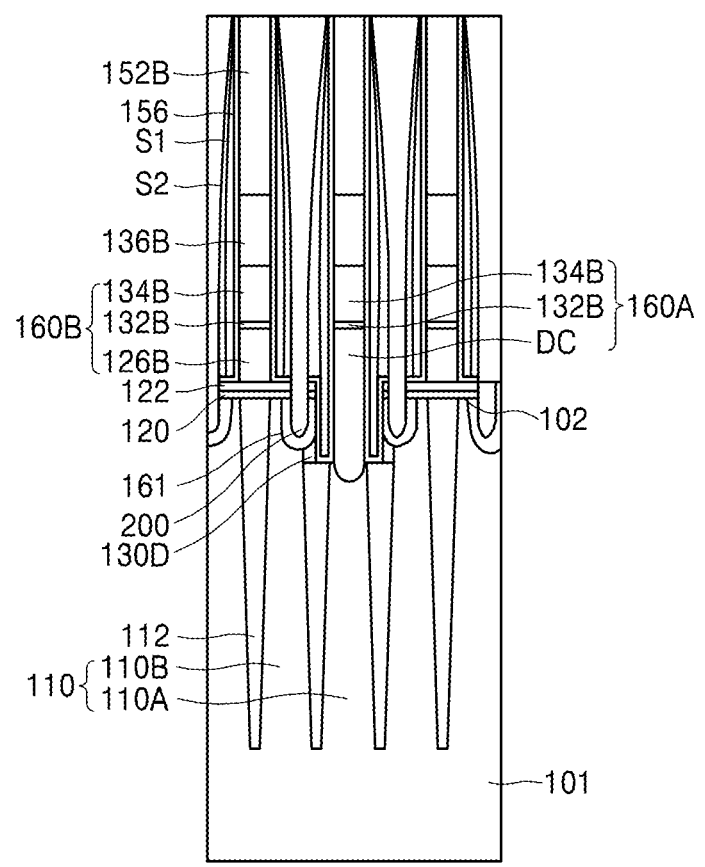

Referring to FIG. 6L, the buried contact 200 connected with the second active area 110B may be formed by filling the plurality of buried contact holes BCH of FIG. 6K with a conductive material. As a result, the buried contact 200 is connected with the second active area 110B. In some example embodiments, the metal silicide layer 161 may be formed on surfaces of the second active area 110B and the contact pad 130D contacting the buried contact 200. The metal silicide layer 161 may be omitted. The conductive material may cover upper surfaces of the first and second bit lines 160A and 160B, the capping layer 136B, and the mask pattern 152B. In this case, a front surface of the resulting structure thereof is partially removed by using an etch back or a CMP process so that nodes of the buried contacts 200 are separated.

Figure 6M:
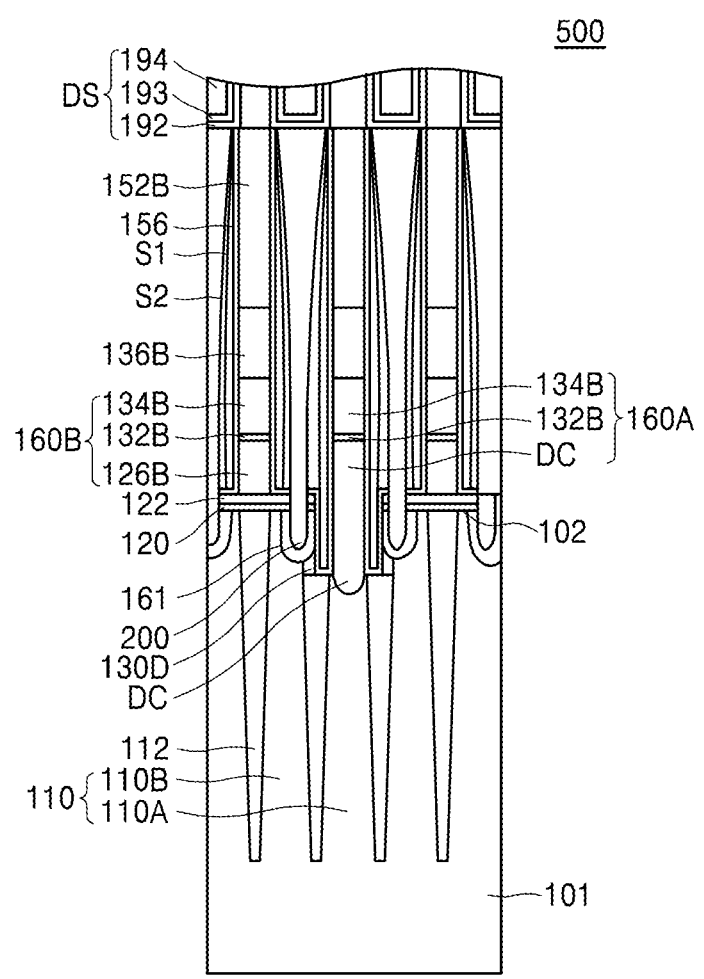

Referring to FIG. 6M, the capacitor DS having the lower electrode 192 connected with an upper surface of the buried contact 200 may be formed. The capacitor DS may include the lower electrode 192, the dielectric layer 193, and the upper electrode 194.

Figure 6N:
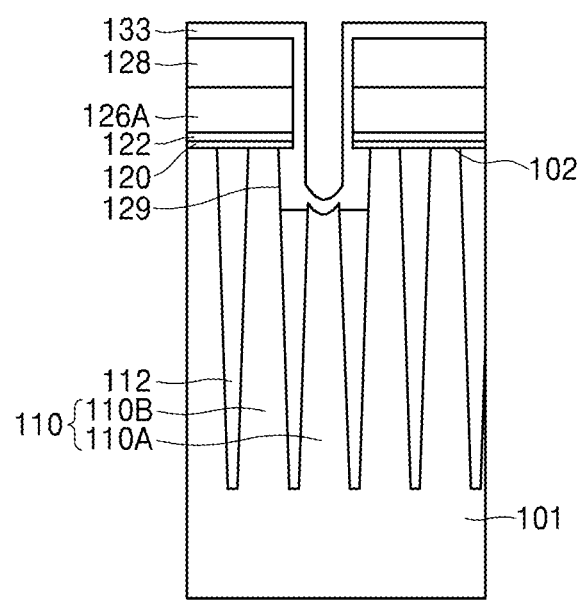
FIG. 6N is a cross-sectional view for describing a process of manufacturing a semiconductor device, according to various example embodiments.

In some example embodiments, while the processes of FIGS. 6A through 6M are substantially identically performed, the process of FIG. 6N, instead of FIG. 6D, may be performed to form the same structure as the contact pad 130B of FIG. 6E.

Referring to FIG. 6N, a conductive layer 133 may be formed in such a way that the conductive layer 133 fills only the inner portion of the recess 129 and covers only a portion of a lower surface or a side wall of the direct contact hole DCH. Then, sequential processes are substantially identical with the processes of FIGS. 6E through 6M. That is, etching is performed by using the mask pattern 128 so that only a portion of the conductive layer 133 of FIG. 6N that fills the recess 129 remains. As a result, the conductive layer 133 of FIG. 6N that fills the recess 129 may form the contact pad 130B.

In some example embodiments, while the processes of FIGS. 6A through 6M are substantially identically performed, the processes of FIGS. 6E and 6F may be omitted to form the semiconductor device 500. That is, the semiconductor device 500 may be formed by performing the processes illustrated in FIGS. 6A, 6B, 6C, 6D, 6G, 6H, 6I, 6J, 6K, 6L, and 6M.

Referring again to FIG. 6G, in the semiconductor device 500, the direct contact DC and the contact pad 130B are formed of or include the same material. Sequential processes after FIG. 6G are substantially identical with the processes of FIGS. 6G through 6M.

Figure 7A:
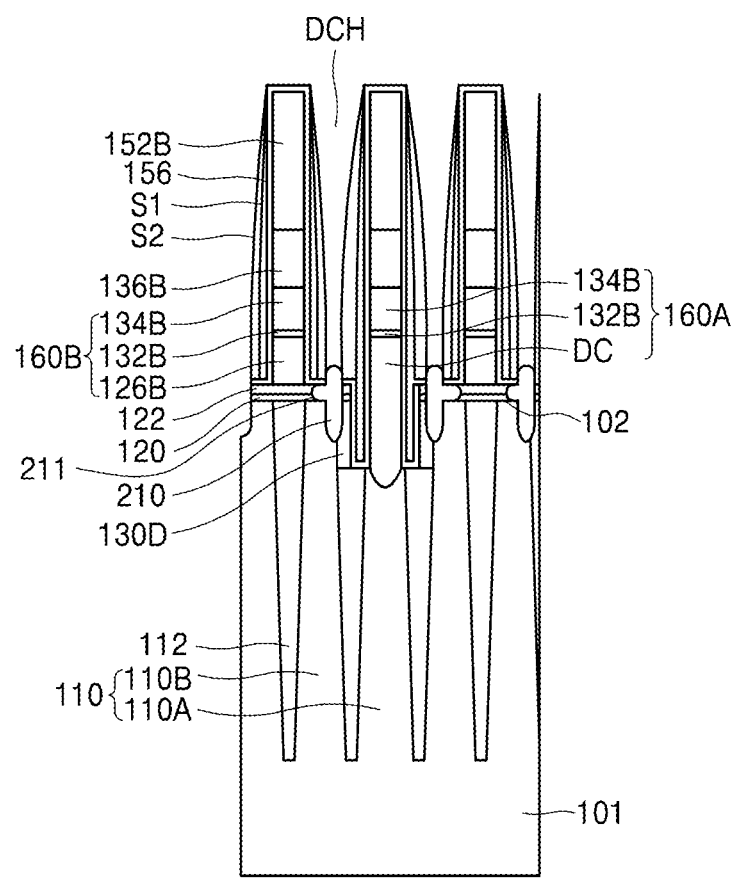
FIGS. 7A and 7B are cross-sectional views for describing a process of manufacturing a semiconductor device, according to various example embodiments.
Figure 7B:
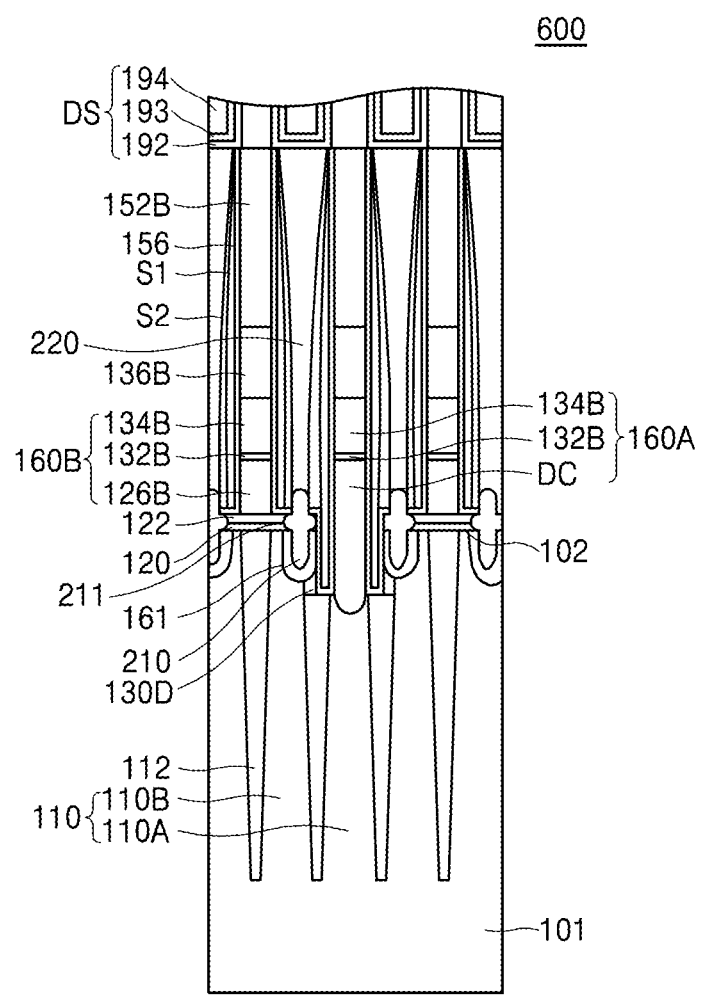

FIGS. 7A and 7B are cross-sectional views for describing a sequential process of manufacturing the semiconductor device 600 according to example embodiments. While the processes of FIGS. 6A through 6M are performed, the process of FIG. 7A may further be performed between the process of FIG. 6K and the process of FIG. 6L to form the semiconductor device 600.

Referring to FIG. 7A, the recess 211 may be formed by etching a bottom of the buried contact hole BCH. The second contact pad 210 may be formed by filling a conductive material in the bottom of the recess 211 and the buried contact hole BCH.

FIG. 7B illustrates the semiconductor device 600 formed by performing the process of FIG. 7A and the sequential processes, that is, the processes of FIGS. 6L through 6M.

Sequential processes after the process of FIG. 7A are substantially identical to the processes of FIGS. 6L through 6M. However, the contact pad 130D of FIGS. 6L through 6M will be referred to as the first contact pad 130D to be distinguished from the second contact pad 210 of FIG. 7A. Also, although FIGS. 6L though 6M do not illustrate the second contact pad 210 at a bottom of the buried contact 200, it may be assumed that the second contact pad 210 is formed and the sequential processes will be referred to. That is, a conductive material is filled in the buried contact hole BCH in which the second contact pad 210 is formed, to form the buried contact 220 connected with the second contact pad 210.

Accordingly, the semiconductor device 600 may be electrically connected with the first contact pad 130D connected with the second active area 110B, the second contact pad 210 connected with the first contact pad 130D, and the buried contact 200 connected with the second contact pad 210.

In some example embodiments, the second contact pad 210 and the buried contact 220 may be formed of or include the same material. The capacitor DS connected to an upper surface of the buried contact 220 may include the lower electrode 192, the dielectric layer 193, and the upper electrode 194.

FIGS. 8A through 8D are cross-sectional views for describing a sequential process of manufacturing the semiconductor device 700 according to example embodiments. While the processes of FIGS. 6A through 6K are identically performed, the processes of FIGS. 8A through 8D may further be performed to form the semiconductor device 700.

Figure 8A:
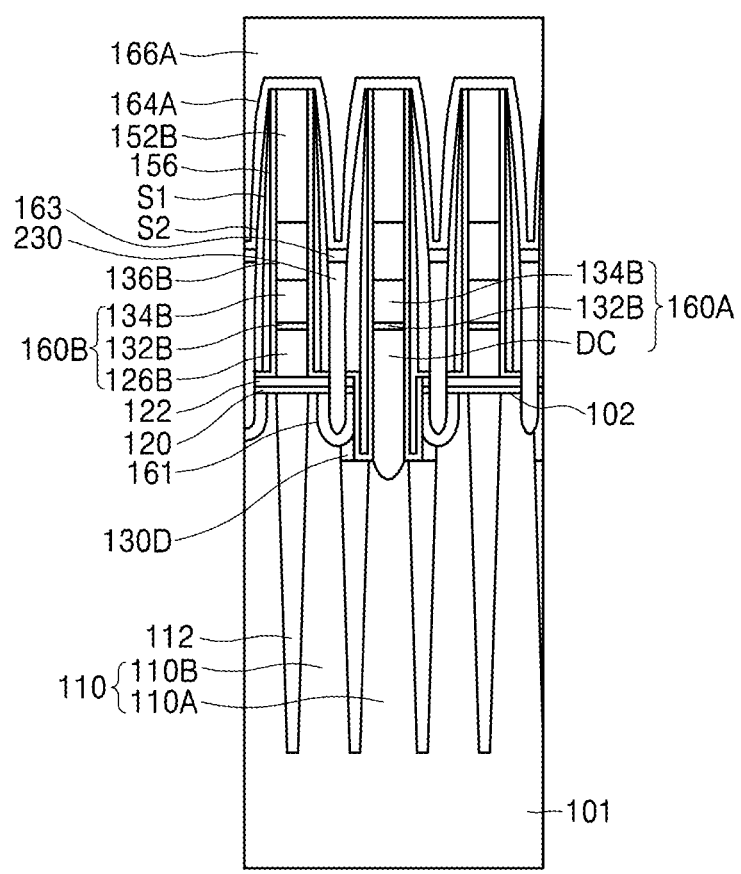
FIGS. 8A through 8D are cross-sectional views for describing a process of manufacturing a semiconductor device, according to various example embodiments.

Referring to FIG. 8A, a conductive layer may be filled in a portion of a bottom of the buried contact hole BCH of FIG. 6K to form the buried contact 230 connected with the second active area 110B. The metal silicide layer 163 may be formed on the buried contact 230. The barrier layer 164A and the conductive layer 166A may be formed on the result thereof. As a result, the barrier layer 164A and the conductive layer 166A may cover the metal silicide layer 163, the insulating liner 156, the insulating spacers S1 and S2, and the mask pattern 152B. Front surfaces of the barrier layer 164A and the conductive layer 166A may be partially removed by an etch back or CMP.

Figure 8B:
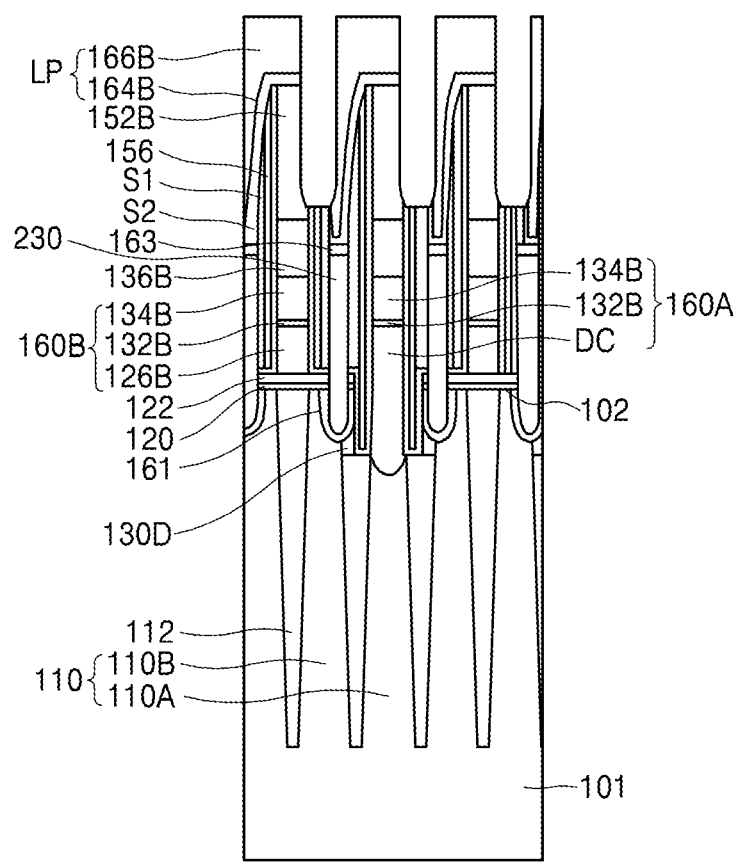

Referring to FIG. 8B, after a mask pattern (not shown) exposing a portion of the conductive layer 166A of FIG. 8A is formed, the barrier layer 164A, the conductive layer 166A, and surrounding insulating layers of FIG. 8A are etched by using the mask pattern as an etch mask. Accordingly, the plurality of landing pads LP formed of or including the barrier layer 164B and the conductive layer 166B may be formed.

Figure 8C:
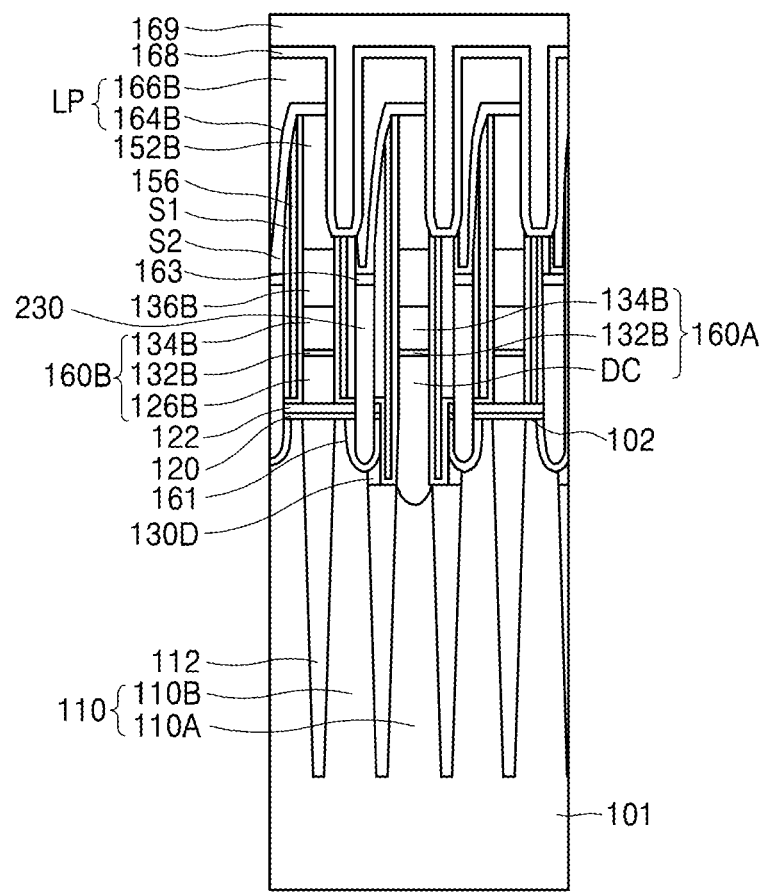

Referring to FIG. 8C, the insulating thin layer 168 and the insulating layer 169 are sequentially formed on an upper surface of the resulting structure including the plurality of landing pads LP.

Then, a front surface of the resulting structure thereof is partially removed (not shown) by an etch back or CMP to form the plurality of landing pads LP. Accordingly, the plurality of landing pads LP are surrounded by the insulating layer 169 and the insulating thin layer 168, and have a shape in which the plurality of landing pads LP are spaced apart from one another.

Figure 8D:
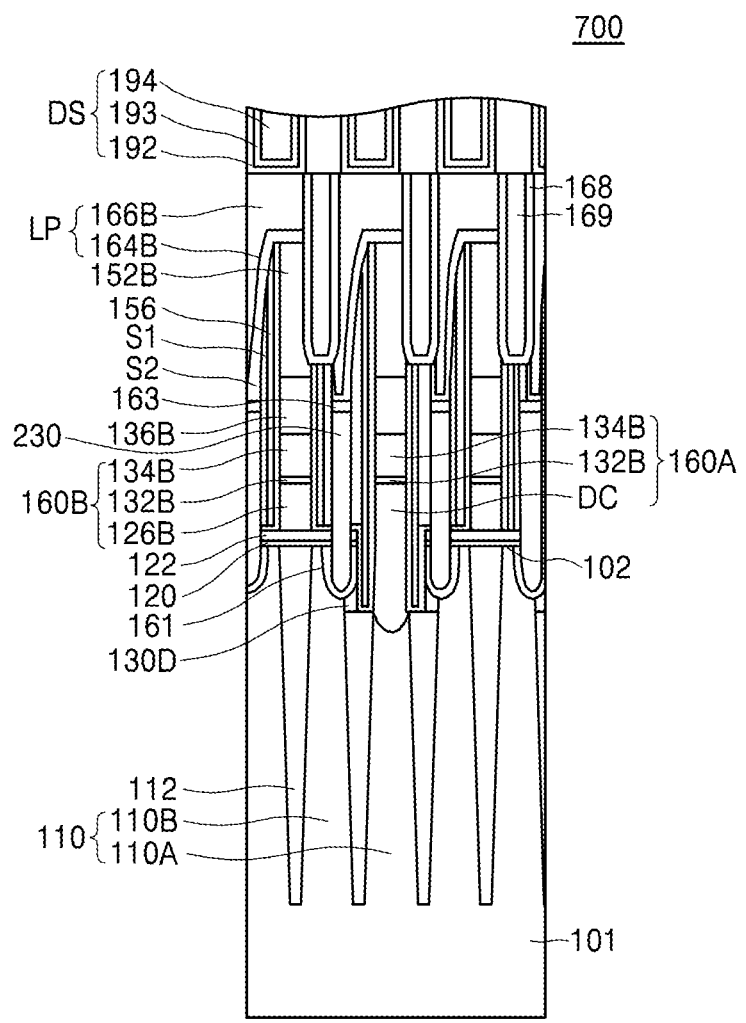

Referring to FIG. 8D, the lower electrode 192 of the capacitor DS is connected on the plurality of landing pads LP to form the semiconductor device 700. The capacitor DS may include the lower electrode 192, the dielectric layer 193, and the upper electrode 194.

FIGS. 9A through 9D are cross-sectional views illustrating a sequential process of manufacturing the semiconductor device 800 according to example embodiments. While the processes of FIGS. 6A through 6L are substantially identically performed, the processes of FIGS. 9A through 9D may further be performed to form the semiconductor device 800.

Figure 9A:
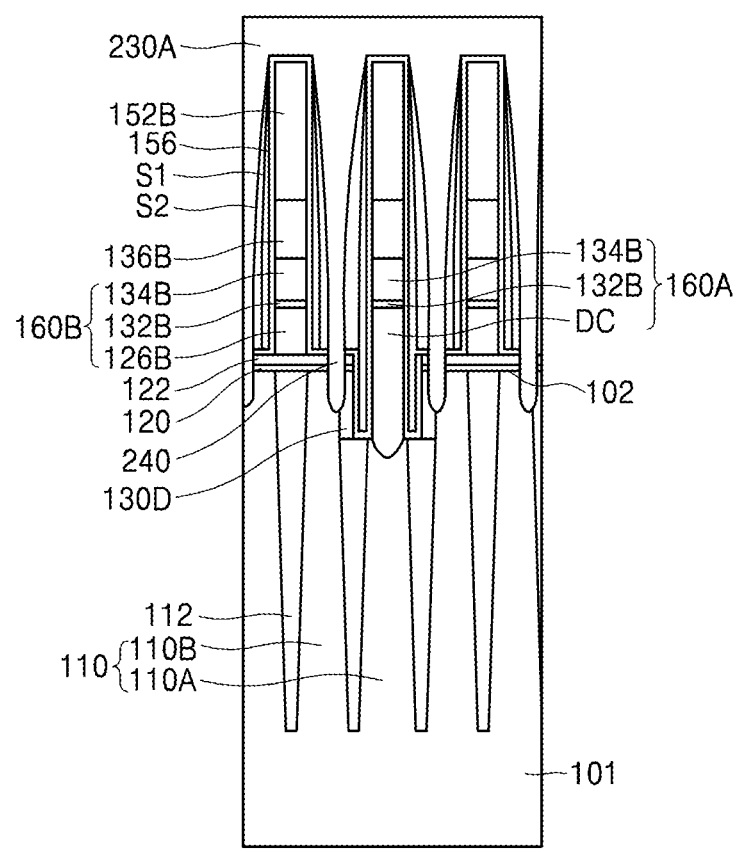
FIGS. 9A through 9D are cross-sectional views for describing a process of manufacturing a semiconductor device, according to various example embodiments.

Referring to FIG. 9A, the conductive layer 230A is filled in the buried contact hole BCH as illustrated in FIG. 6L to form the plurality of buried contacts 240 connected with the second active area 110B.

Figure 9B:
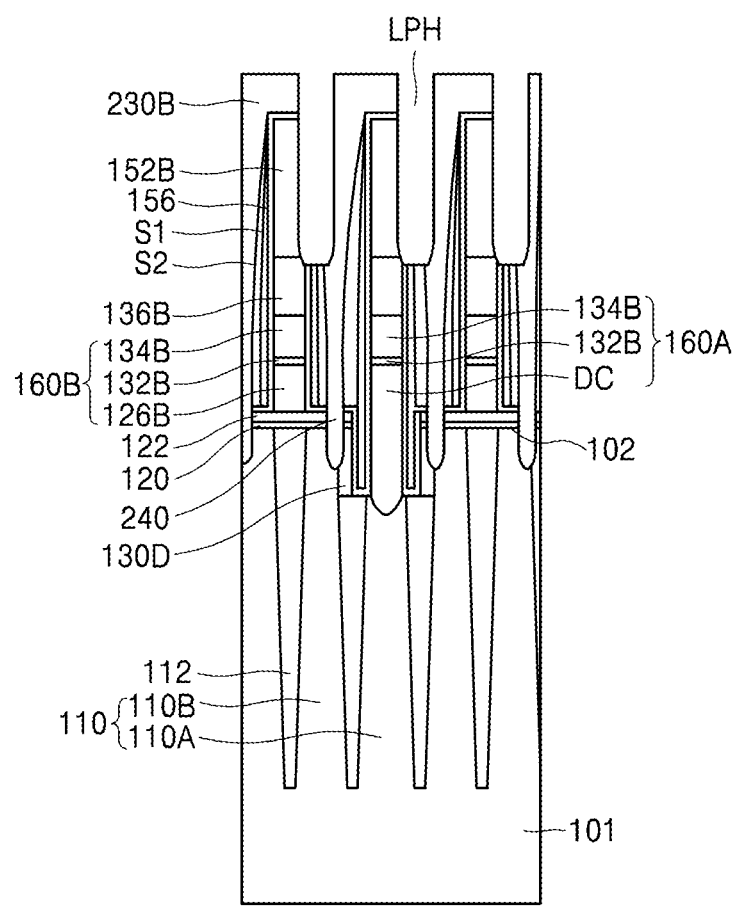

Referring to FIG. 9B, after a mask pattern (not shown) exposing a portion of the conductive layer 230A of FIG. 9A is formed on the conductive layer 230A of FIG. 9A, the conductive layer 230A of FIG. 9A and the surrounding insulating layers are etched by using the mask pattern as an etch mask, to form the plurality of landing pads LP formed of or including the conductive layer 230B remaining by the etching by the mask pattern.

Figure 9C:
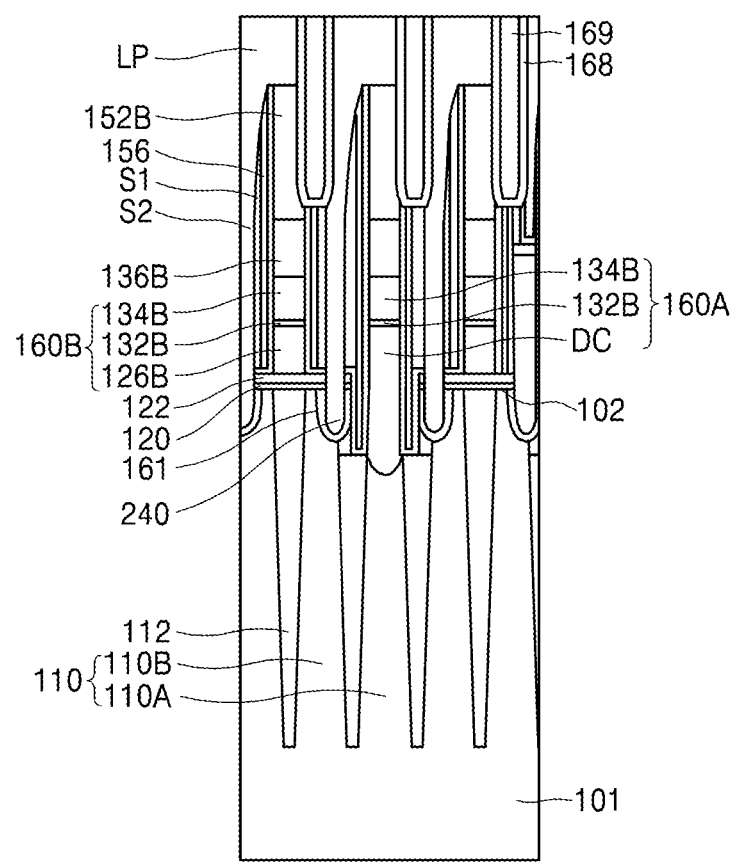

Referring to FIG. 9C, the insulating thin layer 168 is formed on an upper surface of the resulting structure including the plurality of landing pads LP. After the insulating layer 169 is formed on the insulating thin layer 168, a front surface of the resulting structure thereof is partially removed by an etch back or CMP to expose the conductive landing pad LP. Accordingly, the plurality of landing pads LP are surrounded by the insulating layer 169 and the insulating thin layer 168 and have a shape in which the plurality of landing parts LP are spaced apart from one another.

The conductive landing pads LP may be connected with the buried contact 240, the buried contact 240 may be connected with the contact pad 130D, and the contact pad 130D may be electrically connected with the second active area 110B.

Figure 9D:
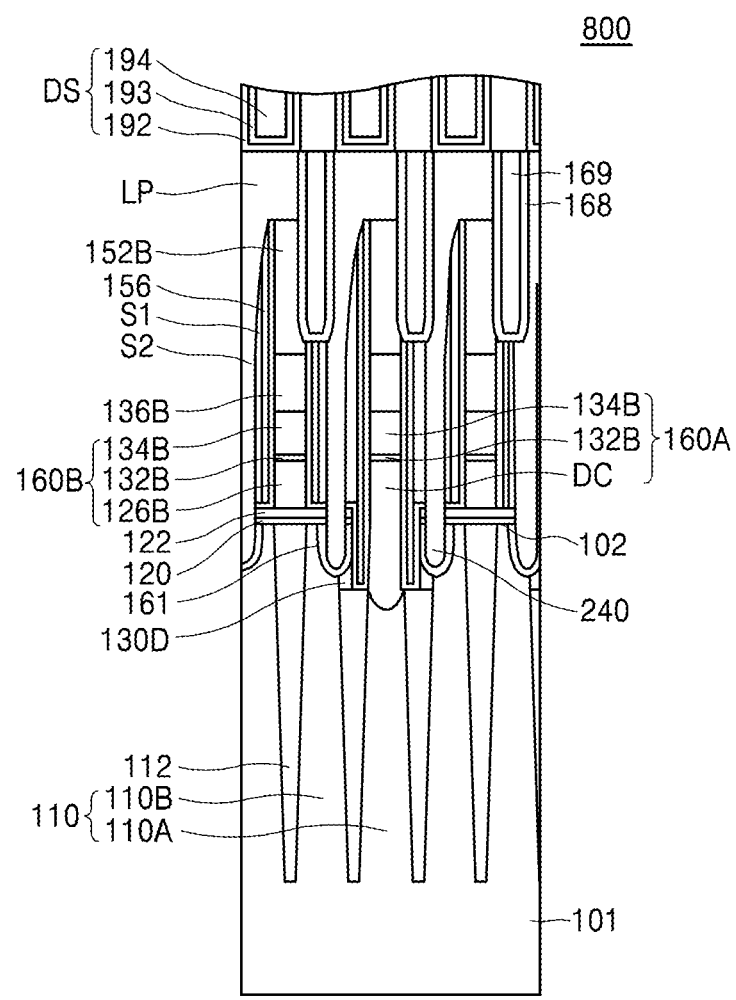

Referring to FIG. 9D, the semiconductor device 800 may be formed by connecting the lower electrode 192 of the capacitor DS on the conductive landing pad LP. The capacitor DS may include the lower electrode 192, the dielectric layer 193, and the upper electrode 194.

Figure 10:
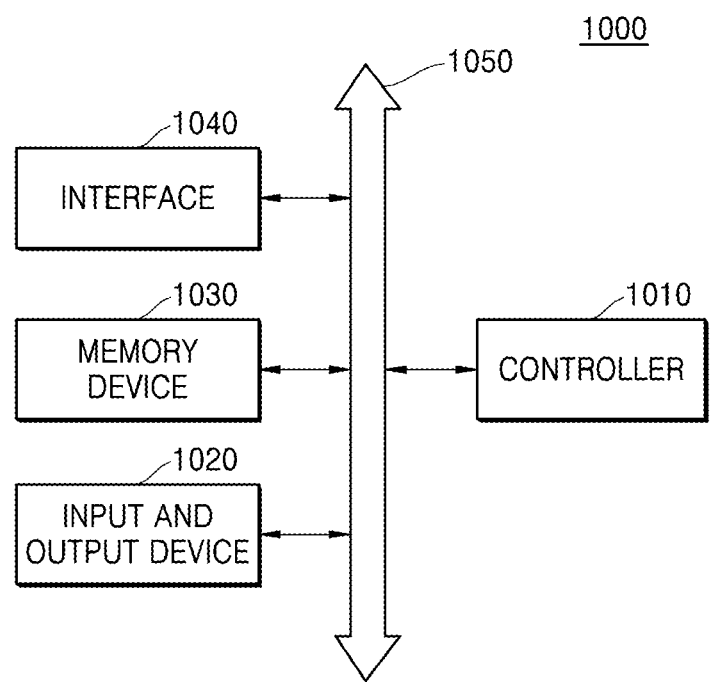
FIG. 10 is a system including a semiconductor device, according to various example embodiments.

FIG. 10 is a system 1000 including a semiconductor device according to example embodiments.

Referring to FIG. 10, the system 1000 includes a controller 1010, an input/output device 1020, a memory device 1030, and an interface 1040. The system 1000 may be a mobile system or a system transmitting or receiving information. In some example embodiments, the mobile system may be a personal digital assistant (PDA), a portable computer, a web tablet, a wireless phone, a mobile phone, a digital music player, or a memory card. The controller 1010 is for controlling running programs in the system 1000 and may include a microprocessor, a digital signal processor, a microcontroller, or a similar or a same device. The input/output device 1020 may be used for inputting or outputting data of the system 1000. The system 1000 may be connected with an external device, for example a personal computer or a network, by using the input/output device 1020, and may mutually exchange data with the external device. The input/output device 1020 may be, for example, a keypad, a keyboard, or a display device.

The memory device 1030 may store a code and/or data for an operation of the controller 1010, or may store data processed in the controller 1010. The memory device 1030 includes a semiconductor device including a fin-type field effect transistor according to example embodiments. For example, the memory device 1030 may include at least one of the semiconductor devices 100, 500, 600, 700, and 800 illustrated in FIGS. 1 through 9D.

The interface 1040 may be a data transmission path between the system 1000 and other external devices. The controller 1010, the input/output device 1020, the memory device 1030, and the interface 1040 may communicate with one another via a bus 1050. The system 1000 may be used in mobile phones, MP3 players, navigation, portable multimedia players (PMP), solid state disk (SSD), or household appliances.

Figure 11:
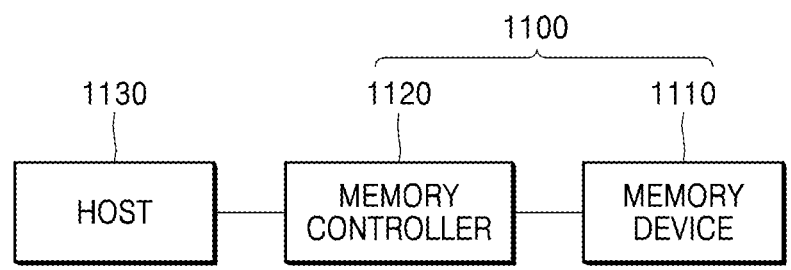
FIG. 11 is a memory card including a semiconductor device, according to various example embodiments.

FIG. 11 is a memory card 1100 including a semiconductor device according to example embodiments.

Referring to FIG. 11, the memory card 1100 includes a memory device 1110 and a memory controller 1120. The memory device 1110 may store data. In some example embodiments, the memory device 1110 may be non-volatile in which stored data may remain even when power supply is stopped. The memory device 1110 may include at least one of the semiconductor devices 100, 500, 600, 700, and 800 illustrated in FIGS. 1 through 9D.

The memory controller 1120 may read data stored in the memory device 1110 or store data of the memory device 1110 in response to a reading/writing request of a host 1130. The memory controller 1120 may include at least one of the semiconductor devices 100, 500, 600, 700, and 800 illustrated in FIGS. 1 through 9D.

While the inventive concepts have been particularly shown and described with reference to example embodiments thereof, it will be understood that various changes in form and details may be made therein without departing from the spirit and scope of the following claims.

What is claimed is:

1. A semiconductor device comprising:
    a semiconductor substrate having a plurality of active areas;
    a bit line crossing the plurality of active areas;
    a direct contact connecting a first active area of the plurality of active areas with the bit line;
    an insulating spacer substantially covering a side wall of the bit line and extending at a level lower than a level of an upper surface of the semiconductor substrate;
    a contact pad connected with a side wall of a second active area of the plurality of active areas, the contact pad being next to the first active area;
    a first insulating pattern defining a contact hole exposing the insulating spacer and the contact pad; and
    a buried contact connected to the contact pad and filling the contact hole.

2. The semiconductor device of claim 1, wherein a height of an upper surface of the contact pad is lower than a level of an upper surface of the plurality of active areas.

3. The semiconductor device of claim 1, wherein the buried contact extends to a lower level than the level of the upper surface of the semiconductor substrate and is connected to the contact pad at a lower level than the level of the upper surface of the semiconductor substrate.

4. The semiconductor device of claim 1, wherein the contact pad is in contact with the insulating spacer.

5. The semiconductor device of claim 1, further comprising
a second insulating pattern defining on the bit line a landing pad hole in communication with the contact hole; and
a landing pad in the landing pad hole connected with the buried contact and vertically overlapping the bit line.

6. The semiconductor device of claim 5, wherein the landing pad comprises a same material as the buried contact.

7. The semiconductor device of claim 1, further comprising a capacitor lower electrode connected with the buried contact.

8. The semiconductor device of claim 1, wherein the contact pad comprises an epitaxial semiconductor layer.

9. The semiconductor device of claim 1, wherein the contact pad comprises a polycrystalline semiconductor layer.

10. The semiconductor device of claim 1, wherein the contact pad comprises a conductive material doped with carbon.

11. The semiconductor device of claim 1, wherein the contact pad comprises a metal.

12. The semiconductor device of claim 1, further comprising a recess communicating with the contact hole and exposing the contact pad, and wherein the buried contact is connected with an inner wall of the recess.

13. The semiconductor device of claim 12, further comprising a second contact pad contacting the inner wall of the recess, wherein the buried contact is connected with the second contact pad.

14. A semiconductor device comprising:
a semiconductor substrate having a plurality of active areas, the plurality of active areas including a first active area and a second active area;
a contact connecting the first active area with a bit line;
an insulating spacer at a side wall of the bit line;
a contact pad connected with a side wall of the second active area;
a contact hole exposing the insulating spacer and the contact pad; and
a buried contact connected to the contact pad and filling the contact hole, a contact area between the buried contact and at least one of the contact pad and the second active area extending over more than one side of the buried contact.

15. The semiconductor device of claim 14, further comprising a first insulating pattern defining the contact hole.

16. The semiconductor device of claim 14, wherein the insulating spacer substantially covers the side wall of the bit line and extends to a level lower than a level of an upper surface of the semiconductor substrate.

17. The semiconductor device of claim 14, wherein the bit line crosses the plurality of active areas.

18. The semiconductor device of claim 14, wherein the contact pad is next to the first active area.

* * * * *